United States Patent
Fujioka et al.

(10) Patent No.: US 11,932,114 B2
(45) Date of Patent: Mar. 19, 2024

(54) POWER ELECTRONICS ASSEMBLY HAVING STAGGERED AND DIAGONALLY ARRANGED TRANSISTORS

(71) Applicant: Toyota Motor Engineering & Manufacturing North America, Inc, Plano, TX (US)

(72) Inventors: Hitoshi Fujioka, Ann Arbor, MI (US); Shailesh N. Joshi, Ann Arbor, MI (US); Danny J. Lohan, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 362 days.

(21) Appl. No.: 17/083,471

(22) Filed: Oct. 29, 2020

(65) Prior Publication Data

US 2022/0134889 A1    May 5, 2022

(51) Int. Cl.
| | | |
|---|---|---|
| *H01L 25/07* | (2006.01) | |
| *B60L 15/00* | (2006.01) | |
| *H01L 23/473* | (2006.01) | |
| *H01L 23/64* | (2006.01) | |

(52) U.S. Cl.
CPC .......... *B60L 15/007* (2013.01); *H01L 23/473* (2013.01); *H01L 23/642* (2013.01); *H01L 25/071* (2013.01)

(58) Field of Classification Search
None
See application file for complete search history.

(56) References Cited

U.S. PATENT DOCUMENTS

| | | | |
|---|---|---|---|
| 5,737,186 A | * | 4/1998 | Fuesser .................. H01C 1/082 257/E23.098 |
| 6,313,598 B1 | * | 11/2001 | Tamba .................. H01L 25/165 361/728 |
| 8,541,875 B2 | | 9/2013 | Bennion et al. |
| 9,991,880 B2 | | 6/2018 | Xu et al. |
| 10,403,558 B2 | | 9/2019 | Xu et al. |
| 10,611,246 B2 | | 4/2020 | Zhou et al. |
| 10,622,593 B2 | | 4/2020 | Xu et al. |
| 2013/0082377 A1 | * | 4/2013 | Bennion ............... H01L 23/473 165/170 |
| 2013/0154084 A1 | * | 6/2013 | Kadoguchi ............. H01L 24/36 257/717 |
| 2018/0145007 A1 | * | 5/2018 | Hatano ............... H01L 23/3675 |
| 2019/0067160 A1 | * | 2/2019 | Xu ....................... H01L 23/3735 |
| 2019/0363599 A1 | | 11/2019 | Hoang et al. |

(Continued)

FOREIGN PATENT DOCUMENTS

| | | |
|---|---|---|
| CN | 105048799 A | 11/2015 |
| DE | 102015012915 A1 | 4/2017 |
| DE | 102017219674 A1 | 5/2019 |

*Primary Examiner* — Benjamin P Sandvik
(74) *Attorney, Agent, or Firm* — Jordan IP Law, LLC

(57) ABSTRACT

Methods, apparatuses and systems to provide for technology to that includes a first power electronics module including a plurality of first transistors that are diagonally offset from each other, and a second power electronics module stacked on the first power electronics module. The second power electronics module includes second transistors that are diagonally offset from each other. The second transistors are staggered relative to the first transistors.

19 Claims, 9 Drawing Sheets

(56) References Cited

U.S. PATENT DOCUMENTS

| | | |
|---|---|---|
| 2020/0111720 A1* | 4/2020 | Wan ........................ H01L 23/36 |
| 2020/0153362 A1 | 5/2020 | Xu et al. |
| 2020/0169186 A1 | 5/2020 | Manser et al. |
| 2021/0035892 A1* | 2/2021 | Chew ................... H01L 25/0652 |
| 2022/0140706 A1* | 5/2022 | Fujioka ............... H01L 23/5385 |
| | | 310/54 |

* cited by examiner

POWER ELECTRONICS ASSEMBLY HAVING STAGGERED AND DIAGONALLY ARRANGED TRANSISTORS

TECHNICAL FIELD

Embodiments generally relate to power electronics assemblies having a reduced size. More particularly, embodiments relate to a power electronics assembly with offset transistors.

BACKGROUND

Semiconductor packages may include numerous electrical components such as power electronic devices (e.g., silicon carbide insulated-gate bipolar transistor or other switching devices) as well as gate drive devices and capacitors. Such semiconductor packages may be used in a variety of contexts, such as the transportation industry (e.g., automotive applications). In the semiconductor packages, the power electronic devices may be separate from the gate drive devices and capacitors. The relative placement of the power electronic devices, the gate drive devices and capacitors may have impactful effects on performance (e.g., cause parasitic inductance) and size.

BRIEF SUMMARY

In some embodiments an electronics apparatus includes a first power electronics module including a plurality of first transistors that are diagonally offset from each other, a second power electronics module stacked on the first power electronics module, where the second power electronics module includes second transistors that are diagonally offset from each other, wherein the second transistors are staggered relative to the first transistors.

In some embodiments, a vehicle includes an electric motor drive, a battery to supply a current to the electric motor drive, and a traction inverter package to modify the current of the battery and provide the modified current to the electric motor drive. The traction inverter package includes a first power electronics module including a plurality of first transistors that are diagonally offset from each other, and a second power electronics module stacked on the first power electronics module. The second power electronics module includes second transistors that are diagonally offset from each other, and the second transistors are staggered relative to the first transistors.

BRIEF DESCRIPTION OF THE SEVERAL VIEWS OF THE DRAWINGS

The various advantages of the embodiments of the instant disclosure will become apparent to one skilled in the art by reading the following specification and appended claims, and by referencing the following drawings, in which:

DETAILED DESCRIPTION

Figure 1A:
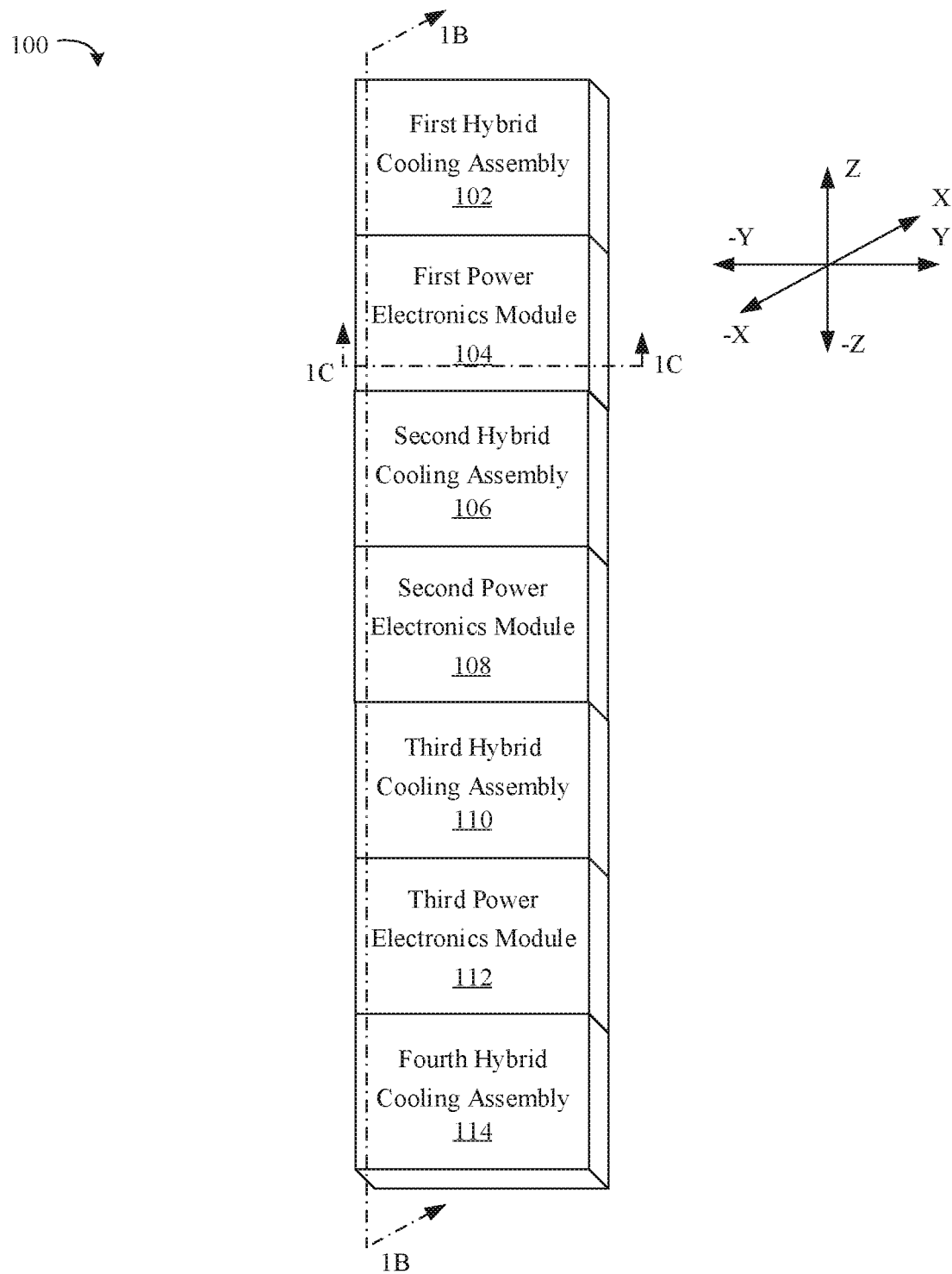
FIG. 1A is a diagram of an example of a power electronics assembly according to an embodiment.

Turning now to FIG. 1A, a power electronics assembly 100 is illustrated. The power electronics assembly 100 includes a series of components stacked on each other in a vertical direction (e.g., along the Z-axis). The stacked components may include a first hybrid cooling assembly 102, a first power electronics module 104, a second hybrid cooling assembly 106, a second power electronics module 108, a third hybrid cooling assembly 110, a third power electronics module 112 and a fourth hybrid cooling assembly 114. As will be discussed in detail below, the arrangement of electronics of the first-third power electronics modules 104, 108, 112 may reduce deleterious effects including parasitic inductance, while also reducing the overall size of the power electronics assembly 100. For example, the placement of high-heat flux components and low-heat flux components may permit a reduction in size of the power electronics assembly 100, while also reducing unwanted thermal effects (e.g., high heat concentrations) and electrical effects (e.g., parasitic induction).

Furthermore, the placement of the first hybrid cooling assembly 102, the second hybrid cooling assembly 106, the third hybrid cooling assembly 110 and the fourth hybrid cooling assembly 114 permits enhanced cooling as will be discussed below. For example, in some embodiments, each of first-fourth hybrid cooling assemblies 102, 106, 110, 114 includes a two-phase cooling structure which aligns with (e.g., is disposed directly above or below) and cools one or more high heat flux devices (e.g., transistors). Further, each of first-fourth hybrid cooling assembly 102, 106, 110, 114 may include a single-phase cooling structure which aligns with and cools one or more low heat flux devices capacitors and/or gate device drivers.

Figure 1B:
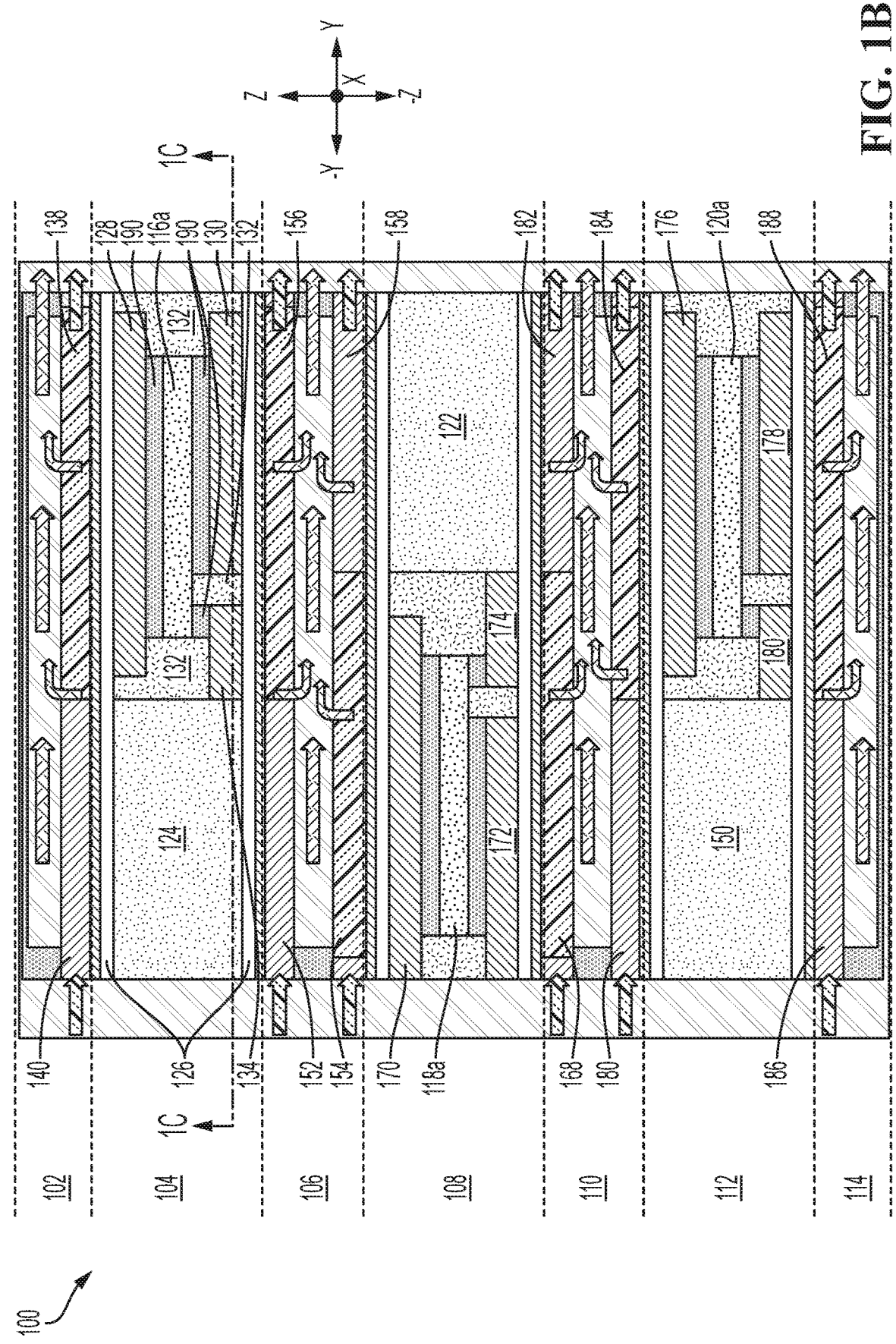
FIG. 1B is a diagram of an example of a front view of the power electronics assembly according to an embodiment.
Figure 1C:
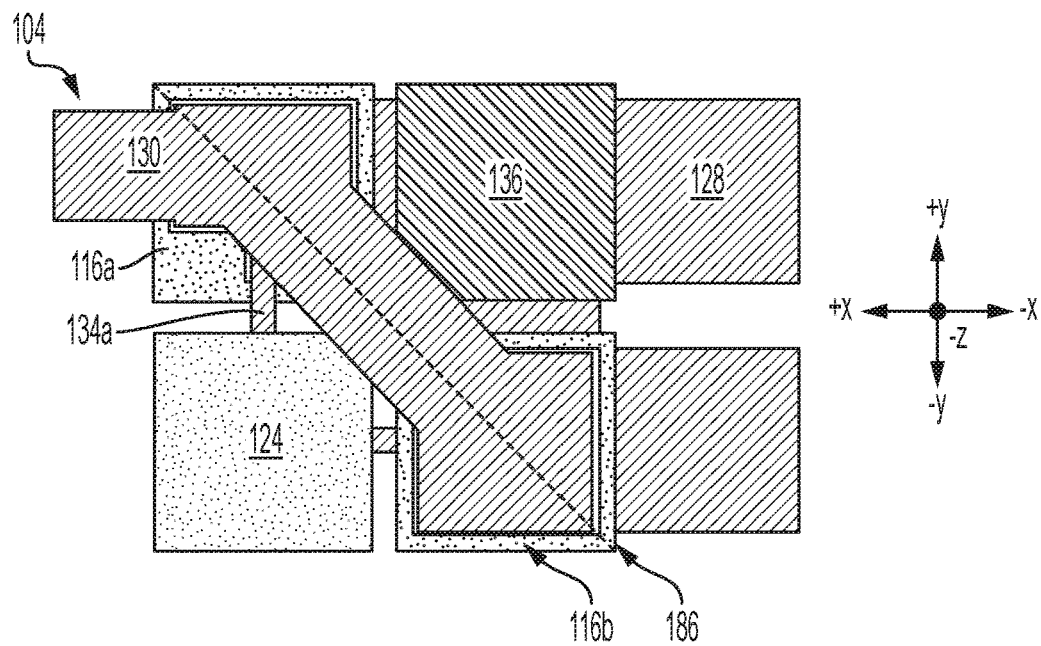
FIG. 1C is a diagram of an example of a down-top view of a first power electronics module of the power electronics assembly according to an embodiment.

FIG. 1B is a more detailed front view (e.g., cross-sectional view) of the power electronics assembly 100 as shown along section or plane 1B-1B of FIG. 1A. FIG. 1C is a side view of a power electronics assembly 100. FIG. 1C is a down-top view (e.g., a plan view) of the first power module electronics module 104 along section or plane 1C-1C of FIGS. 1A and 1B (e.g., the negative Z-axis extends out of the page and the positive Z-axis extends into the page). The plane of FIG. 1B may be perpendicular to the plane of FIG. 1C.

In the present example, the first power electronics module 104 is discussed in detail. It will be understood however that the second and third power electronics modules 108, 112 may include similar components. The first power electronics module 104 incudes a plurality of first transistors 116a, 116b (e.g., a Metal Oxide Silicon Field Effect Transistor, Metal Oxide Semiconductor Field Effect Transistor, insulated-gate bipolar transistor, etc.). The first transistors 116a, 116b are diagonally offset from each other as illustrated in the down-top view of FIG. 1C. For example, a straight line 186 diagonally passes through each of the first transistors 116a, 116b.

Figure 1D:
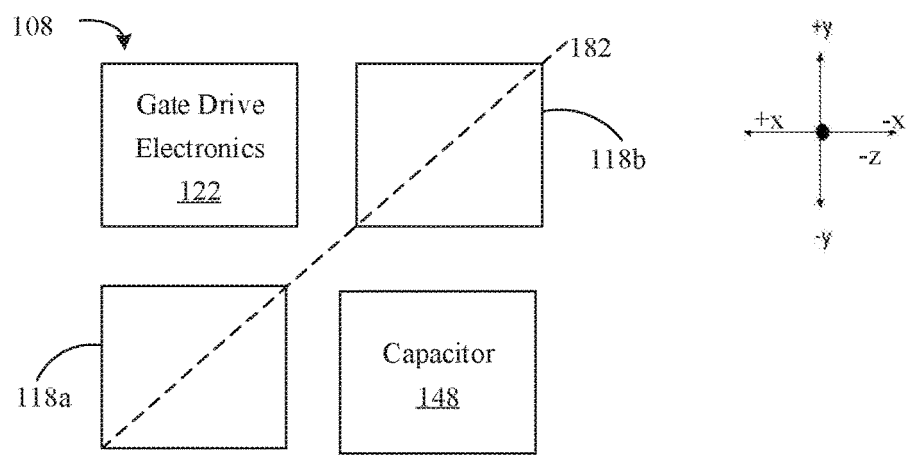
FIG. 1D is a diagram of an example of a down-top view of a second power electronics module of the power electronics assembly according to an embodiment.

The second power electronics module 108 may include a plurality of second transistors including second transistors 118a, 118b. The second transistors 118a, 118b are illustrated in FIG. 1D which is a schematic diagram (e.g., top-down view along z-axis) of the second power electronics module 108. For simplicity, FIG. 1D does not illustrate some of the components of the second power electronics module 108 such as O-busbar 170, P-busbar 172 and N-busbar 174. The second transistors 118a, 118b are diagonally offset from each other as illustrated in FIG. 1D. For example, a straight line 182 diagonally passes through each of the second transistors 118a, 118b. The second transistor 118a is vertically staggered relative to the first transistor 116a and the second transistor 116b. For example, no part of the second transistor 118a is directly beneath the first transistor 116a and the second transistor 116b. In doing so, heat may be distributed more efficiently. The second transistor 118b is vertically staggered relative to the plurality of first transistors 116a, 116b as well so no part of the second transistor 118b is directly vertically under the first transistors 116a, 116b. Thus, no part of the second transistors 118a, 118b are directly vertically under any transistor of the first power electronics module 104 including the first transistors 116a, 116b.

Figure 1E:
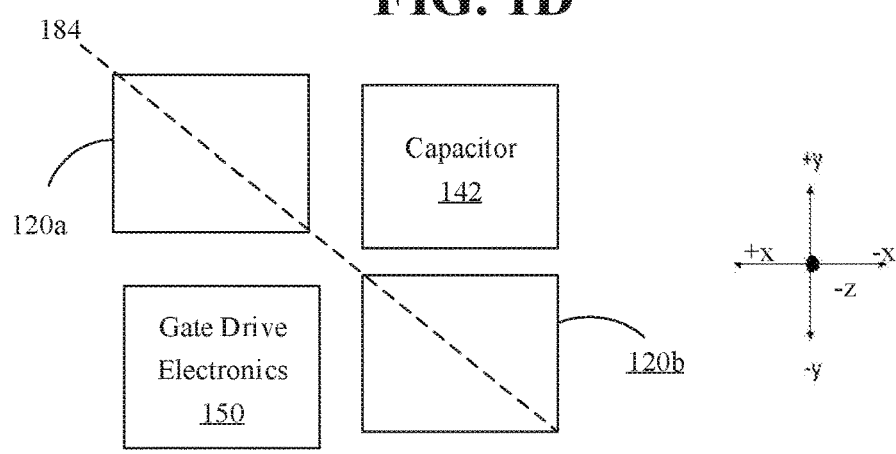
FIG. 1E is a diagram of an example of a down-top view of a third power electronics module of the power electronics assembly according to an embodiment.

The third power electronics module 112 may include a plurality of third transistors 120a, 120b. The third transistors 120a, 120b are illustrated in FIG. 1E which is a schematic diagram (e.g., top-down view along z-axis) of the third power electronics module 112. For simplicity, FIG. 1E does not illustrate some of the components of the third power electronics module 112 such as O-busbar 176, P-busbar 178 and N-busbar 180. The third transistor 120a is vertically staggered relative to the second transistors 118a, 118b. For example, no part of the third transistor 120a is directly vertically beneath the second transistors 118a, 118b. In doing so, heat may be distributed more efficiently. The third power module 112 may include third transistor 120b that is vertically staggered relative to the second transistors 118a, 118b and any other transistor of the second power module 108 to avoid being directly vertically below any transistor of the second power module 108 including the second transistors 118a, 118b. Furthermore, the third transistor 120b may be diagonally offset relative to the third transistor 120a. For example, a diagonal line 184 passes through the third transistors 120a, 120b.

In contrast, the third transistor 120a may be directly below the first transistor 116a. Low power electronic elements (e.g., capacitor and/or gate drive devices) of the second power module 108 may at least partly occupy the space in-between the third transistor 120a and the first transistor 116a. In this example, gate drive electronics 122 are disposed in-between the third transistor 120a and the first transistor 116a. The gate drive electronics 122 may be connected to a gate of the second transistor 118a to supply voltages to a gate of the second transistor 118a to operate the second transistor 118a.

The first power electronics module 104 may also include gate drive electronics 124 and first and second portions of insulation 126 that are respectively directly above and below the second transistor 118a and gate drive electronics 124. The first power electronics module 104 further includes an O-busbar 128 that electrically connects to the first transistor 116a. The first power electronics module 104 further includes a P-busbar 130 that electrically connects to the first transistor 116a to operate the first transistor 116a. The first power electronics module 104 further includes an N-busbar 134 that may be electrically connected to the first transistor 116a to operate the first transistor 116a. The first power electronics module 104 may further include mold resin 132. The gate drive electronics 124 may control a gate voltage for the first transistor 116a. For example, the gate drive electronics 124 may provide a gate signal to a gate signal input pad of the first transistor 116a via a gate signal wiring pattern, such as the N-busbar 134 and/or solder 190. The gate driver electronics 124 may control a voltage of the gate signal provided to the gate signal input pad of the first transistor 116a. Solder 190 may electrically connect the N-busbar 134, O-busbar 128 and P-busbar 130 to electrically connect to the first transistor 116a.

As illustrated in FIG. 1C, the first power electronics module 104 may further include a capacitor 136. The capacitor 136 may be coupled to an input busbar such as one or more of the N-busbar 134 or P-busbar 130. In some embodiments, electrical isolation layers may be between the O-busbar 128, N-busbar 134 and P-busbar 130 and first-fourth hybrid cooling assemblies 102, 106, 110, 114.

The capacitor 136 and the gate drive electronics 124 occupy "negative spaces" between first transistors 116a, 116b. The capacitor 136 and the gate drive electronics 124 may be "low heat flux devices" that may not generate as much heat as the first transistors 116a, 116b that may be "high heat flux devices." Thus, disposing the capacitor 136 and the gate drive electronics 124 between the first transistors 116a, 116b may reduce concentration of excessive heat. For example, the capacitor 136 and the gate drive electronics 124 are uncovered by the first transistors 116a, 116b.

The power electronics assembly 100 may further include first-fourth hybrid cooling assemblies 102, 106, 110, 114 that each include cooling liquid to cool the first-third power electronics modules 104, 108, 112. For example, the first hybrid cooling assembly 102 may cool the first transistor 116a and the gate drive electronics 124. To do so, the first hybrid cooling assembly 102 may include a two-phase cooling portion 138 adjacent to (e.g., directly above) the first transistor 116a to cool the first transistor 116a. At the two-phase cooling portion 138, coolant may move through metal inverse opals (MIO) or porous metal structure by capillary flow. Heat from the first transistor 116a may cause the coolant to change from liquid to vapor, hence resulting in two-phase cooling.

Compared to single-phase cooling, two-phase cooling may achieve greater heat transfer away from electronic components. Thus, the two-phase cooling portion 138 of the first hybrid cooling assembly 102 may apply to high heat flux devices (cool the high heat flux devices). Further, the first hybrid cooling assembly 102 may include a single-phase cooling portion 140 to cool low heat flux devices, such as the capacitor 136 and the gate drive electronics 124. As illustrated, the first transistor 116a is sandwiched between the two-phase cooling portion 138 of the first hybrid cooling assembly 102, and a two-phase cooling portion 156 of the second hybrid cooling assembly 106.

Cooling fluid flows along the y-axis in the two-phase cooling portion 138 and single-phase cooling portion 140 (e.g., hybrid two-phase cooling), to cool the electronic components on both sides. At the two-phase cooling portion 138, the coolant flows through metal inverse opals (MIO) or porous metal structure by capillary flow, and the coolant changes from liquid to vapor due to the heat of electronic components. Compared with single-phase cooling, two-phase cooling achieves orders of magnitude heat transfer enhancement. Therefore, the two-phase cooling is applied for high heat flux electronic devices (e.g., transistors such as MOSFETs). On the other hand, the single-phase cooling is applied for low heat flux electronic devices (e.g., gate driver devices and capacitors).

The second and third hybrid cooling assemblies 106, 110 are disposed in interior portions of the power electronics assembly 100, and may include single-phase cooling portions 152, 158, 180, 182 stacked on the two-phase cooling portions 154, 156, 168, 184 to cool components on vertically opposite sides of the second and third hybrid cooling assemblies 106, 110. For example, the second cooling hybrid cooling assembly 106 may include the single-phase cooling portion 152 adjacent to gate drive electronics 124 and a two-phase cooling portion 154 adjacent to second transistor 118a. The single-phase cooling portion 152 may be directly on and stacked on the two-phase cooling portion 154 that cools second transistor 118a. The second hybrid cooling assembly 106 may further include a single-phase cooling portion 158 adjacent to gate drive electronics 122 and a two-phase cooling portion 156 adjacent to transistor 116a. The single-phase cooling portion 158 may be stacked on and in direct contact with the two-phase cooling portion 156.

The third hybrid cooling assembly 110 may include two-phase cooling portions 168, 184 and single-phase cooling portions 180, 182 that align with and cool high-heat flux devices and low-heat flux devices. Thus, the second transistor 118a may be disposed between two-phase cooling portion 154 of the second hybrid cooling assembly 106 and the two-phase cooling portion 168 of the third hybrid cooling assembly 110. The two-phase cooling portion 184 may cool the third transistor 120a. The single-phase cooling portions 180, 182 may respectively cool the gate drive electronics 150, 122.

The fourth cooling portion 114 may include two-phase cooling portion 188 and single-phase cooling portion 186 that are arranged to cool high-heat flux components and low-heat flux components respectively. For example, the two-phase cooling portion 188 may cool the third transistor 120a, and the single-phase cooling portion 186 may cool the gate drive electronics 150.

FIG. 1D illustrates a portion of the second power electronics module 108. As illustrated, the second transistors 118a, 118b are diagonally arranged relative to each other. Gate drive electronics 122 and a capacitor 148 are arranged in the negative spaces of the second power electronics modules 108. FIG. 1E illustrates a portion of the third power electronics module 112. As illustrated, the third transistors 120a, 120b are diagonally arranged relative to each other. Gate drive electronics 142 and a capacitor 150 are arranged in the negative spaces of the second power electronics modules 108.

While not specifically illustrated, the second transistor 118b may be sandwiched between and cooled by two-phase cooling portions of the second hybrid cooling assembly 106 and third hybrid cooling assembly 110. The third transistor 120b may be sandwiched between and cooled by two-phase cooling portions of the third hybrid cooling assembly 110 and fourth hybrid cooling assembly 114. The capacitor 148 may be sandwiched between and cooled by single-phase cooling portions of the first hybrid cooling assembly 102 and second hybrid cooling assembly 106. The capacitor 142 may be sandwiched between and cooled by single-phase cooling portions of the third hybrid cooling assembly 110 and fourth hybrid cooling assembly 114.

The capacitor 148 may also be directly between the first transistor 116b and the third transistor 120b along the z-axis (vertical direction). The capacitor 142 may be directly beneath the second transistor 118b.

Thus, some embodiments provide an enhanced structure to enhance electrical and thermal effects. Furthermore, some embodiments reduce an overall size of semiconductor devices.

Figure 2A:
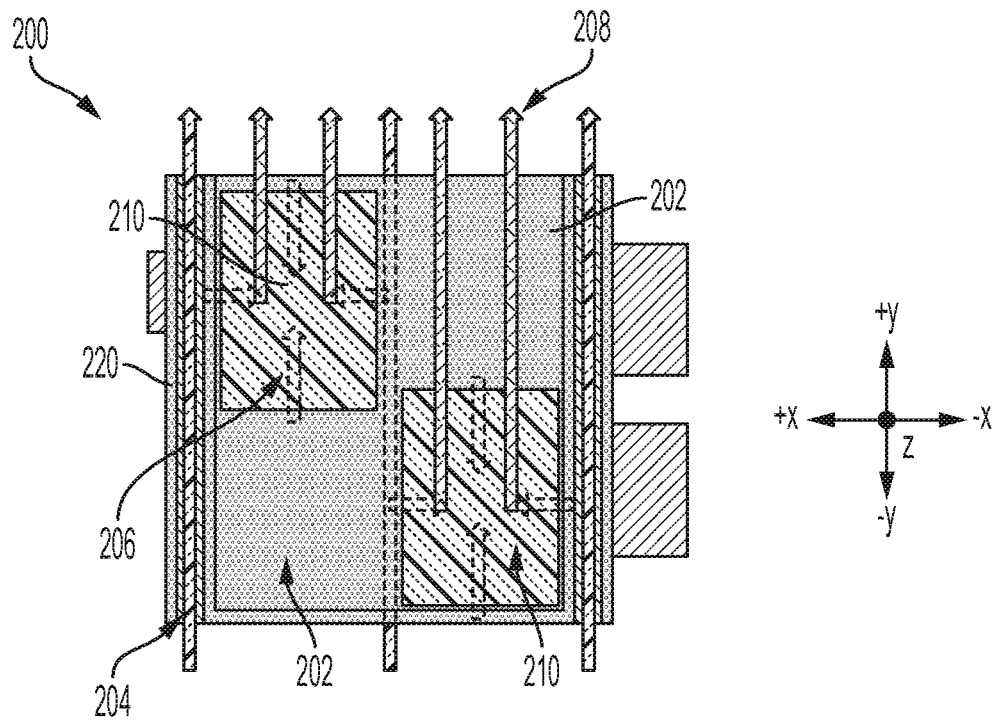
FIG. 2A is a diagram of an example of a top-down view of a hybrid cooling assembly that includes the hybrid cooling according to an embodiment.
Figure 2B:
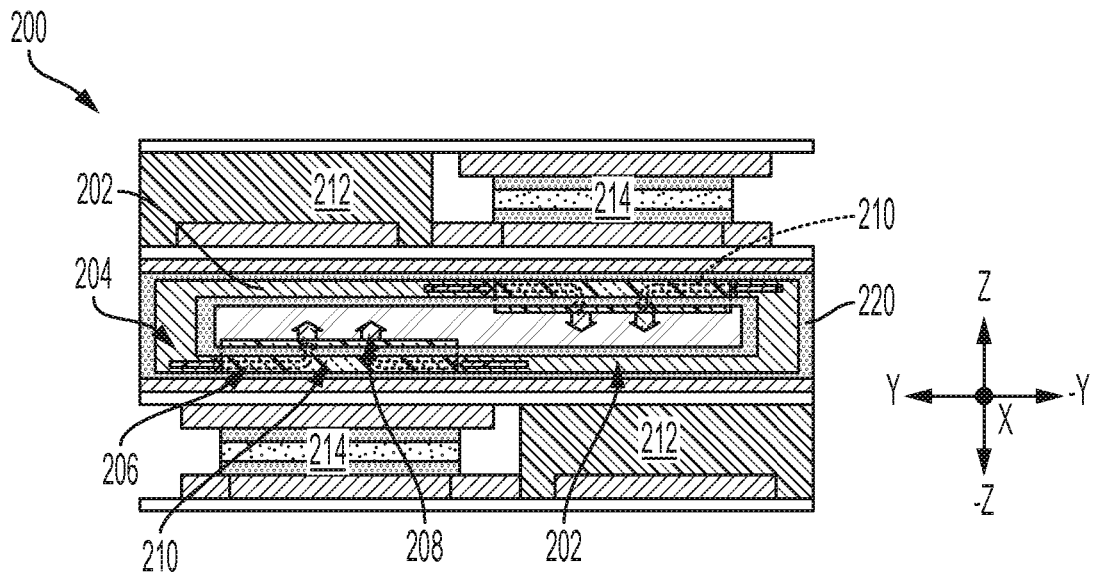
FIG. 2B is a diagram of an example of a front view of an electronic assembly according to an embodiment.

FIGS. 2A and 2B illustrate an electronic assembly 200 that includes a hybrid cooling assembly 220. The hybrid cooling assembly 220 may be readily substituted for any of the first-fourth hybrid cooling assemblies 102, 106, 110, 114 of FIGS. 1A and 1B with some modifications to align two-phase cooling portions with high heat flux components and single-phase cooling portions with low heat flux components. FIG. 2A is a top-down view of a hybrid cooling assembly 220 of the assembly 200. FIG. 2B is a front view of the assembly 200. There are two-phase cooling portions 210 and single-phase cooling portions 202. Coolant 204 may pass through the single-phase cooling portions 202 for example. Each of the two-phase cooling portions 210 may include a capillary flow, such as the capillary flow 206. The two-phase cooling portions 210 may be a MIO or Porous metal structure. The two-phase cooling portions 210 may generate vapor 208.

As illustrated, the single-phase cooling portions 202 may align with capacitors 212 to cool the capacitors 212. The two-phase cooling portions 210 may align with transistors 214 to cool the transistors 214.

Figure 3:
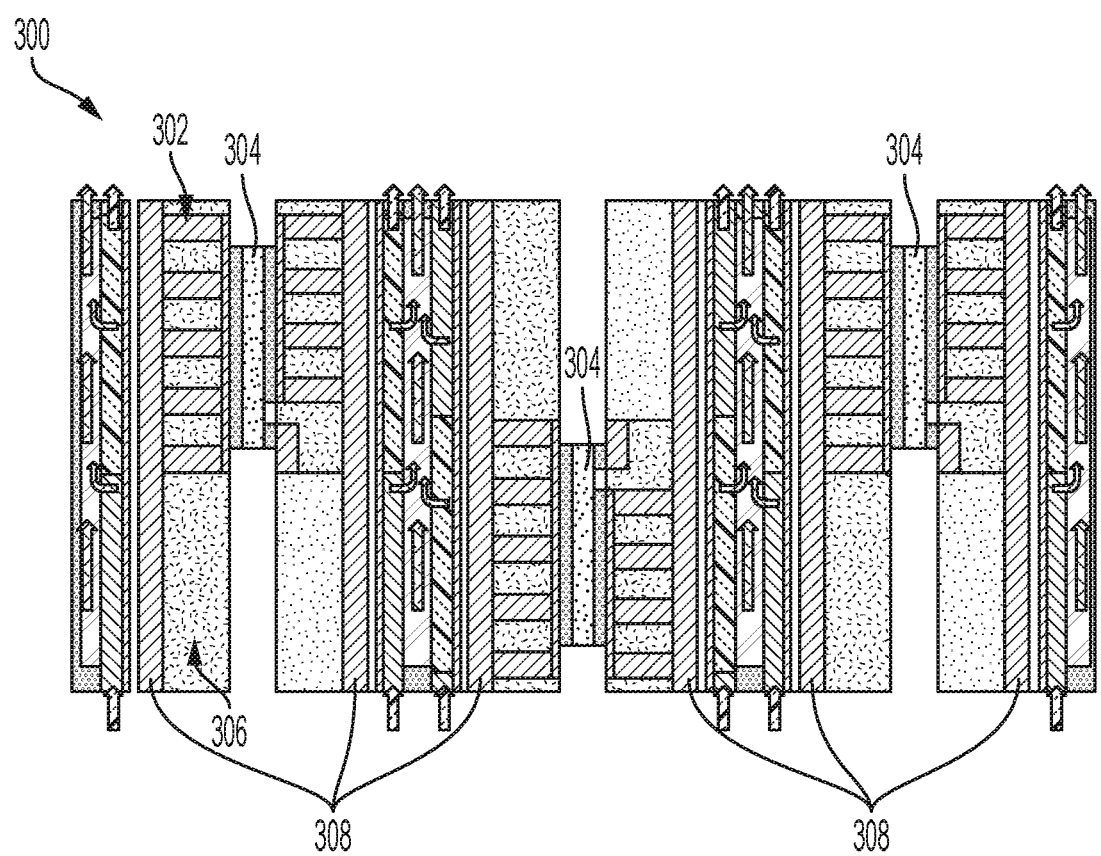
FIG. 3 is a diagram of an example of a front view of a power electronics assembly according to an embodiment.

FIG. 3 is a side view of a power electronics assembly 300 with vias 302. Transistors (e.g., MOSFETs) devices 304 may be electrically connected to the input/output busbars 308 through a plurality of vias 302 in a particle circuit board 306 (PCB). In some embodiments, the input/output busbar is separated from the device 304 by the PCB 306. The power electronics assembly 300 may be readily substituted for the power electronics assembly 100 (FIG. 1) already discussed.

Figure 4A:
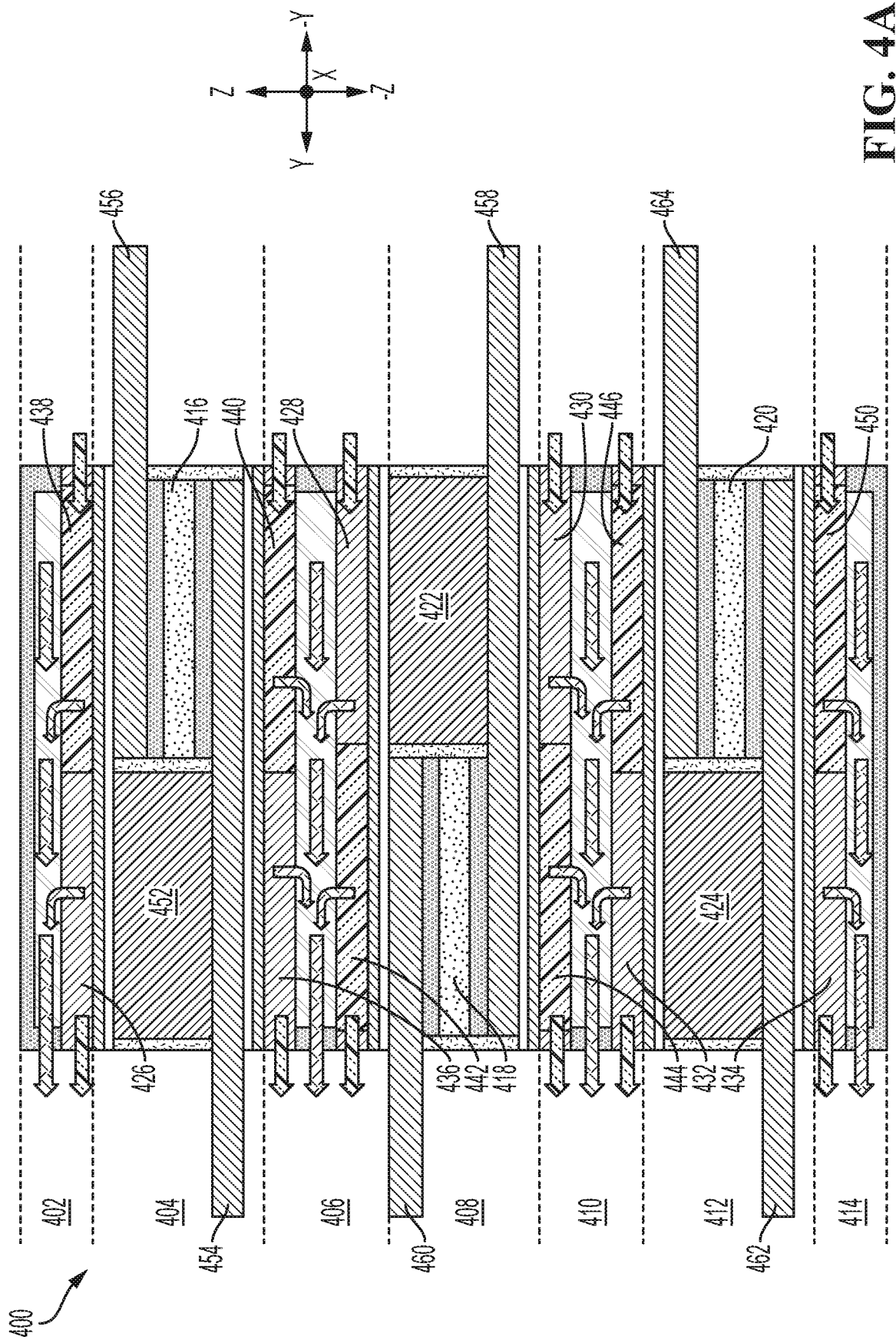
FIG. 4A is a diagram of an example of a front view of a power electronics assembly according to an embodiment.

FIG. 4A is a front view of a power electronics assembly 400. The power electronics assembly 400 includes a series of components stacked on each other in a vertical direction (e.g., along the Z-axis). The stacked components may include a first hybrid cooling assembly 402, a first power electronics module 404, a second hybrid cooling assembly 406, a second power electronics module 408, a third hybrid cooling assembly 410, a third power electronics module 412 and a fourth hybrid cooling assembly 414.

Similar to as discussed with respect to the power electronics assembly 100 (FIG. 1), transistors 416, 418, 420 of the first power electronics module 404, the second power electronics module 408 and the third power electronics module 412 are vertically staggered relative to each other. Single phase cooling portions 426, 428, 436, 430, 432, 434 are also disposed proximate to capacitors 422, 424, 452 to cool the capacitors 422, 452, 424. Double phase cooling portions 438, 440, 442, 444, 446, 450 are also disposed proximate to the transistors 416, 418, 420 to cool the transistors 416, 418, 420. Busbars 454, 456, 458, 460, 462, 464 are connected the transistors 416, 418, 420. Each of the first power electronics module 404, the second power electronics module 408 and the third power electronics module 412 may further gate device drivers which are not illustrated in FIG. 4A. Furthermore, each of the first power electronics module 404, the second power electronics module 408 and the third power electronics module 412 may include other transistors which are not illustrated in FIG. 4A and that are vertically staggered relative to each other.

Figure 4B:
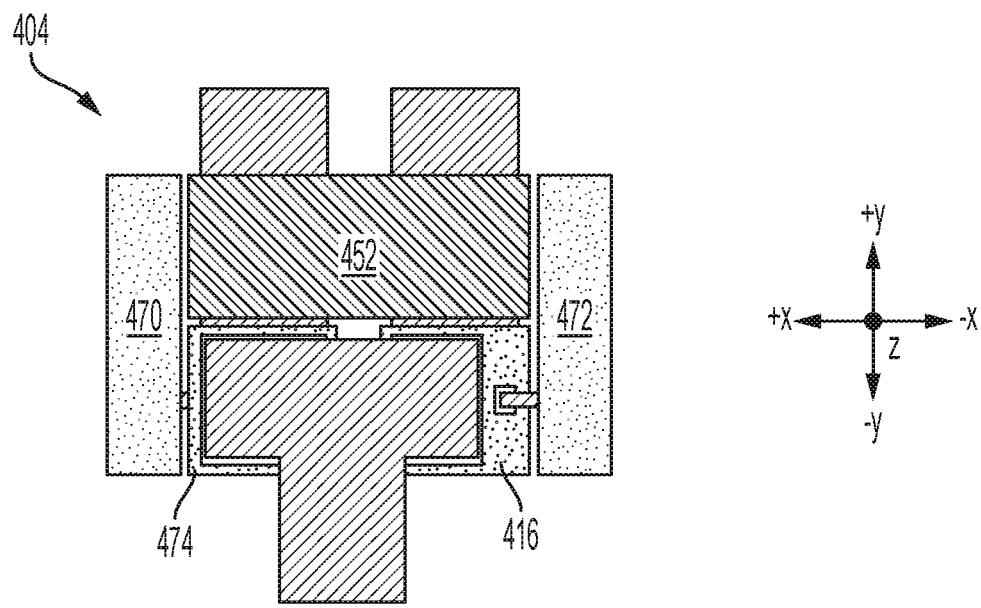
FIG. 4B is a top-down view of a first power electronics module diagram of an example of a schematic of the power electronics assembly according to an embodiment.

For example, FIG. 4B is a schematic top-down view of the first power electronics module 404. The first power electronics module 404 includes a transistor 474 adjacent to transistor 416. Furthermore, gate device drivers 470, 472 are separated and disposed on opposite sides of the capacitor 452 and transistors 416, 474. The third power electronics module 412 may be similarly formed.

Figure 4C:
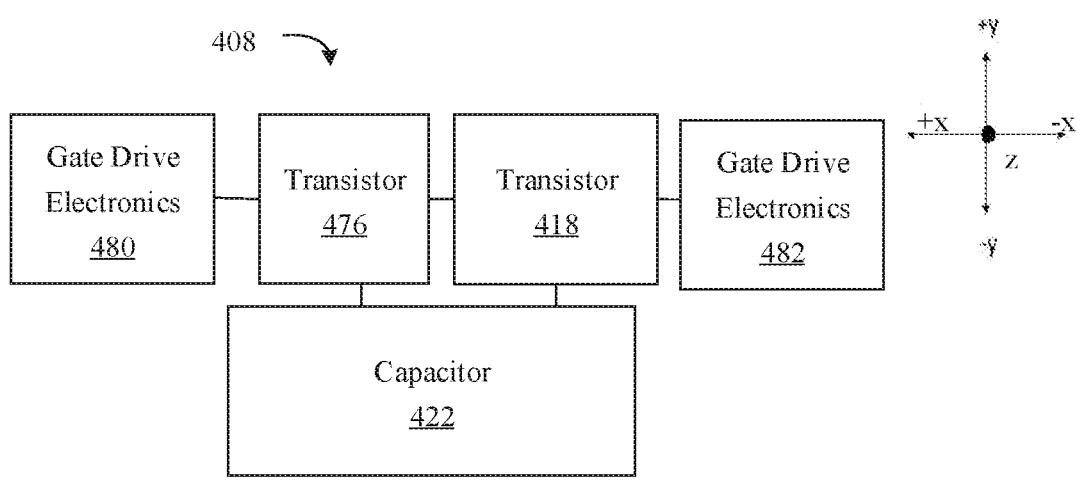
FIG. 4C is a diagram of an example of a top-down schematic view of a second power electronics module of the power electronics assembly according to an embodiment.

FIG. 4C is a schematic top-down view that omits some portions of the second power electronic module 408 for clarity. The relative positions of the components of the second power electronic module 408 may be of note. In this particular example, the transistors 476, 418 are disposed directly below the capacitor 452 so that no part of the transistors 476, 418 are below the transistors 474, 416. The gate drive electronics 480, 482 are separated and disposed on opposite sides of the transistors 476, 418.

Figure 5:
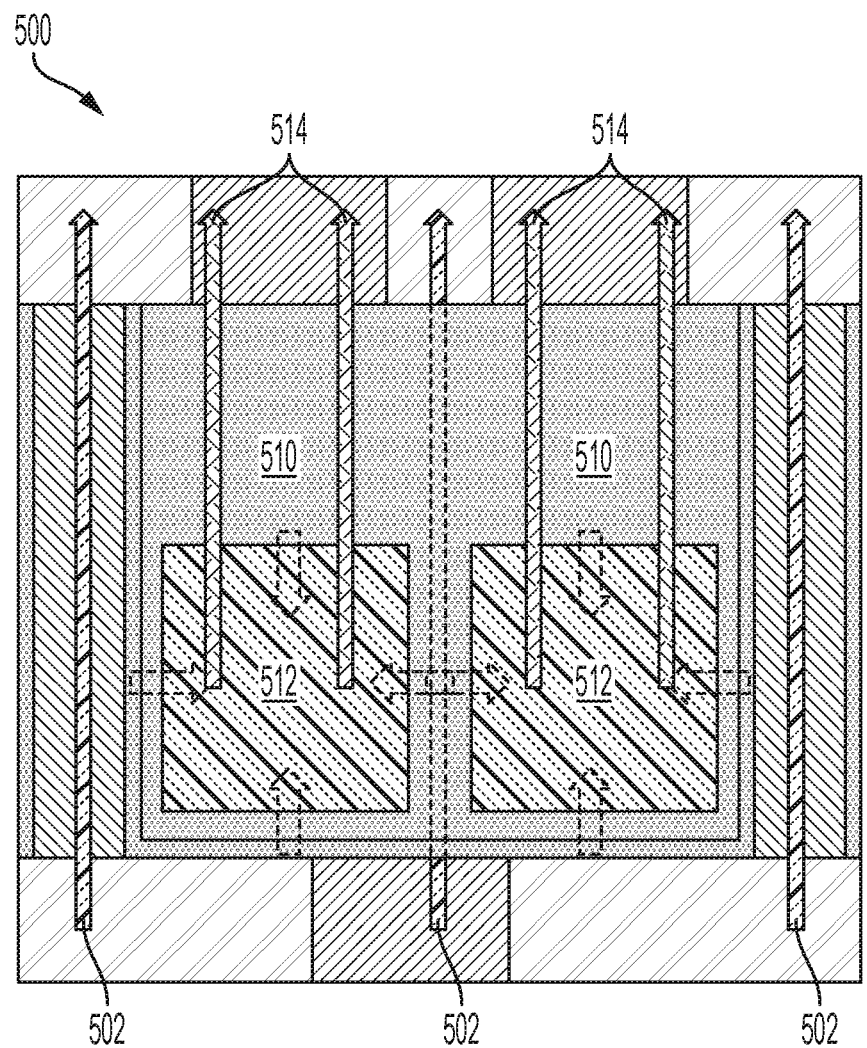
FIG. 5 is a diagram of an example of a top-down view of a hybrid cooling assembly according to an embodiment.

FIG. 5 is a top-down view of a hybrid cooling assembly 500. Hybrid cooling assembly 500 may be readily substituted for any of the first hybrid cooling assembly 402, the second hybrid cooling assembly 406, the third hybrid cooling assembly 410 and the fourth hybrid cooling assembly 414 of FIG. 4A.

The hybrid cooling assembly 500 includes two-phase cooling portions 512 and single-phase cooling portions 510. Coolant 502 may pass through the single-phase cooling portions 510 for example. Each of the two-phase cooling portions 512 may include a capillary flow as illustrated by the hatched arrows. The two-phase cooling portions 512 may be a MIO or Porous metal structure. The two-phase cooling portion 512 may generate vapor 514. Coolant 502 may flow through the hybrid cooling assembly 500.

Figure 6:
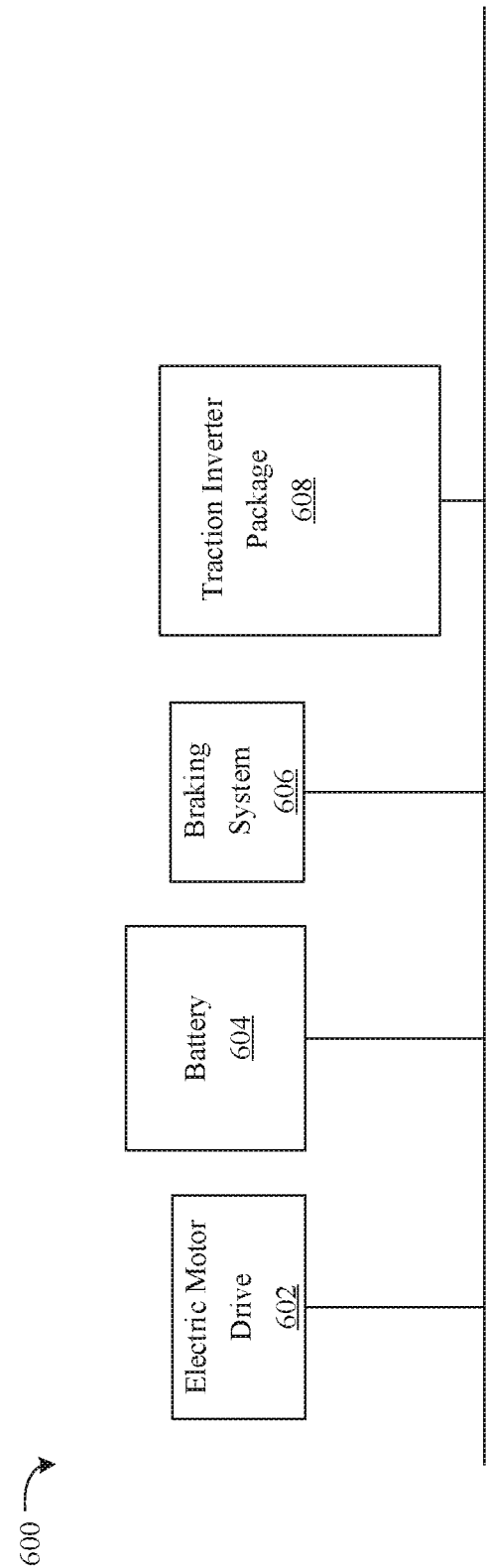
FIG. 6 is a block diagram of an example of a vehicle according to an embodiment.

FIG. 6 illustrates a vehicle 600 that includes a traction inverter package 608. The traction inverter package 608 may be coupled to battery 604 and electric drive motor 602. The traction inverter package 608 may to convert DC current from the battery 604 to AC current. The traction inverter package 608 may provide the AC current to the electric motor drive 602 to drive a propulsion system of the vehicle 600. Moreover, the traction inverter package 608 may capture energy from the braking system 606 and feeding the energy back to the battery 604.

The above described methods and systems may be readily combined together if desired. The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present instant disclosure can be implemented in a variety of forms. Therefore, while the embodiments of this instant disclosure have been described in connection with particular examples thereof, the true scope of the embodiments of the instant disclosure should not be so limited since other modifications will become apparent to the skilled practitioner upon a study of the drawings, specification, and following claims.

We claim:

1. An electronics apparatus comprising:
   a first power electronics module including
      a first transistors that are diagonally offset from each other,
      a gate drive device electrically connected to the first transistors and disposed adjacent the first transistors in a first view of the electronics apparatus, wherein the first transistors and the gate drive device are disposed at a same level, and
      a capacitor adjacent to the first transistors in the first view, wherein in the first view, the capacitor is diagonally offset from the gate drive device; and
   a second power electronics module disposed under the first power electronics module, wherein the second power electronics module includes second transistors that are diagonally offset from each other, wherein the second transistors are staggered relative to the first transistors,
   wherein the first transistors are disposed over the second transistors so that no part of the second transistors is directly vertically under any of the first transistors.

2. The electronics apparatus of claim 1, wherein the first transistors are disposed over the second transistors to avoid being directly vertically above the second transistors.

3. The electronics apparatus of claim 1, wherein the gate drive device is at the same level as the first transistors in a second view of the electronics apparatus.

4. The electronics apparatus of claim 3, wherein the gate drive device is uncovered by the first transistors in the first view of the electronics apparatus.

5. The electronics apparatus of claim 3, wherein the capacitor is electrically connected to the first transistors.

6. The electronics apparatus of claim 5, wherein in the first view, a line diagonally passes through each of the first transistors.

7. An electronics apparatus comprising:
   a first power electronics module including first transistors that are diagonally offset from each other;
   a second power electronics module stacked on the first power electronics module, wherein the second power electronics module includes second transistors that are diagonally offset from each other, wherein the second transistors are staggered relative to the first transistors;
   a gate drive device electrically connected to the first transistors and adjacent to the first transistors in a first view of the electronics apparatus; and
   a capacitor electrically connected to the first transistors and adjacent to the first transistors in the first view of the electronics apparatus,
   wherein in the first view, the capacitor is diagonally offset from the gate drive device.

8. The electronics apparatus of claim 7, wherein the capacitor is uncovered by the first transistors in the first view.

9. The electronics apparatus of claim 5, wherein:
   the first view is a plan view of the first power electronics module;
   the first transistors are diagonally offset from each other in the plan view;
   at least one transistor of the second transistors is staggered relative to at least one transistor of the first transistors in a cross-sectional view of the electronics apparatus; and the first transistors are disposed over the second transistors to avoid being directly above the second transistors in the cross-sectional view.

10. The electronics apparatus of claim 5, further comprising a cooling device disposed between the first power electronics module and the second power electronics module, the cooling device including:
   single-phase cooling portions that cool the capacitor and the gate drive device; and
   two-phase cooling portions that cool the first transistors and the second transistors.

11. A vehicle comprising:
   an electric motor drive;
   a battery to supply a current to the electric motor drive; and
   a traction inverter package to modify the current of the battery and provide the modified current to the electric motor drive, the traction inverter package including:
   a first power electronics module including
      a plurality of first transistors that are diagonally offset from each other,
      a gate drive device electrically connected to the first transistors and disposed adjacent the first transistors in a first view of the traction inverter package, wherein the first transistors and the gate drive device are disposed at a same level, and
      a capacitor adjacent to the first transistors in the first view, wherein in the first view, the capacitor is diagonally offset from the gate drive device; and
   a second power electronics module disposed under the first power electronics module, wherein the second power electronics module includes second transistors that are diagonally offset from each other, wherein the second transistors are staggered relative to the first transistors,
   wherein the first transistors are disposed over the second transistors so that no part of the second transistors is directly vertically under any of the first transistors.

12. The vehicle of claim 11, wherein the first transistors are disposed over the second transistors to avoid being directly vertically above the second transistors.

13. The vehicle of claim 11, wherein the gate drive device is at the same level as the first transistors in a second view of the traction inverter package.

14. The vehicle of claim 13, wherein the gate drive device is uncovered by the first transistors in the first view.

15. The vehicle of claim 13, wherein the capacitor is electrically connected to the first transistors.

16. The vehicle of claim 15, wherein in the first view, a line diagonally passes through each of the first transistors.

17. The vehicle of claim 15, wherein the capacitor is uncovered by the first transistors in the first view.

18. The vehicle of claim 15, wherein:
   the first view is a plan view of the first power electronics module;
   the first transistors are diagonally offset from each other in the plan view;
   at least one transistor of the second transistors is staggered relative to at least one transistor of the first transistors in a cross-sectional view of the traction inverter package; and
   the first transistors are disposed over the second transistors to avoid being directly above the second transistors in the cross-sectional view.

19. The vehicle of claim 15, further comprising a cooling device disposed between the first power electronics module and the second power electronics module, the cooling device including:
   single-phase cooling portions that cool the capacitor and the gate drive device; and
   two-phase cooling portions that cool the first transistors and the second transistors.

* * * * *